(12) United States Patent
Jeon et al.

(10) Patent No.: US 9,362,224 B2
(45) Date of Patent: Jun. 7, 2016

(54) ELECTRICAL FUSE AND METHOD OF FABRICATING THE SAME

(71) Applicant: MagnaChip Semiconductor, Ltd., Cheongju (KR)

(72) Inventors: SeongDo Jeon, Cheongju (KR); JinSeop Shim, Cheongju (KR); JaeWoon Kim, Anyang (KR); SungRyul Baek, Cheongju (KR); JongSoo Kim, Yongin (KR); YunHie Choi, Suwon (KR); SuJin Kim, Cheonan (KR); SungBum Park, Seongnam (KR)

(73) Assignee: Magnachip Semiconductor, Ltd., Cheongju (KR)

( * ) Notice: Subject to any disclaimer, the term of this patent is extended or adjusted under 35 U.S.C. 154(b) by 221 days.

(21) Appl. No.: 13/926,710

(22) Filed: Jun. 25, 2013

(65) Prior Publication Data

US 2014/0091427 A1    Apr. 3, 2014

(30) Foreign Application Priority Data

Sep. 28, 2012  (KR) .................. 10-2012-0109499

(51) Int. Cl.
| | | |
|---|---|---|
| *H01L 29/06* | (2006.01) | |
| *H01L 29/04* | (2006.01) | |
| *H01L 29/41* | (2006.01) | |
| *H01L 23/525* | (2006.01) | |
| *H01L 23/522* | (2006.01) | |
| *G11C 17/18* | (2006.01) | |
| *G11C 17/16* | (2006.01) | |

(52) U.S. Cl.
CPC ............ *H01L 23/5256* (2013.01); *G11C 17/16* (2013.01); *G11C 17/18* (2013.01); *H01L 23/5226* (2013.01); *H01L 2924/0002* (2013.01)

(58) Field of Classification Search
CPC ............ H01L 23/5256; H01L 23/5265; H01L 23/5226; G11C 17/16; G11C 17/18
USPC ............. 257/50, 209, 347, 529, 665, E23.149
See application file for complete search history.

(56) References Cited

U.S. PATENT DOCUMENTS

| | | | | |
|---|---|---|---|---|
| 7,784,009 B2* | 8/2010 | Booth et al. | ................... | 257/529 |
| 8,361,887 B2* | 1/2013 | Cestero | ............... | H01L 23/5252 257/530 |
| 2005/0274966 A1* | 12/2005 | Matsunaga | ............ | G11C 17/18 257/96 |
| 2005/0285224 A1* | 12/2005 | Tsutsui | ......................... | 257/531 |
| 2006/0197179 A1* | 9/2006 | Park | ....................... | G11C 17/16 257/529 |
| 2009/0243032 A1* | 10/2009 | Chen | ............................. | 257/529 |
| 2009/0261450 A1* | 10/2009 | Cheng et al. | .................. | 257/529 |

(Continued)

FOREIGN PATENT DOCUMENTS

| | | |
|---|---|---|
| CN | 102157491 A | 8/2011 |
| KR | 10-2009-0023939 A | 3/2009 |

OTHER PUBLICATIONS

Chinese Office Action issued Dec. 3, 2015 in counterpart Application No. CN 201310424645.3 (7 pages, in Chinese).

*Primary Examiner* — Dale E Page
*Assistant Examiner* — Paul Budd
(74) *Attorney, Agent, or Firm* — NSIP Law

(57) ABSTRACT

An electrical fuse is provided. The electrical fuse includes an anode formed on a substrate, a cathode formed on the substrate, a fuse link connecting the anode and the cathode to each other, a first contact formed on the anode, and a second contact formed on the cathode and arranged closer to the fuse link than the first contact.

21 Claims, 7 Drawing Sheets

(56) References Cited

U.S. PATENT DOCUMENTS

| | | | |
|---|---|---|---|
| 2009/0294900 A1* | 12/2009 | Choserot et al. | 257/529 |
| 2010/0090751 A1* | 4/2010 | Cheng | H01L 23/5256 327/525 |
| 2011/0101493 A1* | 5/2011 | Wu | H01L 23/5256 257/529 |
| 2012/0243289 A1* | 9/2012 | Kanda | G11C 17/16 365/96 |
| 2013/0082347 A1* | 4/2013 | Chen | H01L 23/5256 257/529 |
| 2014/0319651 A1* | 10/2014 | Wu | H01L 23/5256 257/529 |

* cited by examiner

ELECTRICAL FUSE AND METHOD OF FABRICATING THE SAME

CROSS-REFERENCE TO RELATED APPLICATION

This application claims the benefit under 35 U.S.C. §119 (a) of Korean Application No. 10-2012-0109499, filed on Sep. 28, 2012, in the Korean Intellectual Property Office, the entire disclosure of which is incorporated herein by reference for all purposes.

BACKGROUND

1. Field

The following description relates to a fuse of a semiconductor device, and, for example, to an electrical fuse of an electrically programmable semiconductor device and a method for fabricating the same.

2. Description of Related Art

With the high integration and high storage capacity of modern semiconductor devices, a defect may occur in a memory cell of the semiconductor devices during the fabrication process. This may lead to a reduction in product yield.

In order to improve the product yield that is reduced due to the high integration of modern semiconductor memory devices, the technology of redundancy circuitry has been developed. In a redundancy circuit technology, a predetermined test is performed to detect cells in which a defect has occurred. In the event that a defect is detected, a corresponding fuse within a fuse box is selectively opened, whereby a main cell having the defect may be replaced with a redundancy cell that is provided around the main cell, using a redundancy circuit.

Often, the fuse is blown by irradiating the fuse with a laser beam to form the circuit. However, this type of fuse structures are not highly reliable and cannot be used at a package level. Also, with this technique, it is difficult to reduce the pitch of the fuse. With the increasing minimization of chip sizes, it is difficult for this type of fuses to be used in chips having small dimensions.

Recently, in order to minimize chip sizes, an electrical fuse system that shorts a fuse by applying an electrical current has been developed. In an electrical fuse system, a programming current flows through a fuse link, causing the fuse link to heat and open. This programming process may also be referred to as blowing the fuse.

However, in these electrical fuses, because the contacts are arranged at a wide end portion of the cathode, away from the fuse link, electromigration occurs over a relatively wide area, whereby a large current becomes necessary during the blowing process.

SUMMARY

In one general aspect, there is provided an electrical fuse, including: an anode formed on a substrate; a cathode formed on the substrate; a fuse link connecting the anode and the cathode to each other; a first contact formed on the anode; and a second contact formed on the cathode and arranged closer to the fuse link than the first contact.

In the general aspect of the electrical fuse, the fuse link may be arranged between the anode and the cathode.

In the general aspect of the electrical fuse, the cathode may include three regions of equal width lateral to a side of the cathode connected to the fuse link, and the second contact may be formed in a region connected to the fuse link among the three regions of equal width.

In the general aspect of the electrical fuse, the anode, the cathode and the fuse link may be formed of a deposition structure of semiconductor portions and metal silicide portions.

In the general aspect of the electrical fuse, the semiconductor portions may be doped polysilicons or undoped polysilicons.

In the general aspect of the electrical fuse, the metal silicide portions may include metal atoms selected from a group consisting of Ti, Co, Ni, Ta, Al, Zr, Hf, W, Pt, Pd, Mo and their combination.

In the general aspect of the electrical fuse, the metal silicide portion may have a thickness of 20 nm to 50 nm.

The general aspect of the electrical fuse may further include a first set of contacts formed on the anode and a second set of contacts formed on the cathode, in which the first set of contacts includes two or more contacts, and the first contact is one of the two or more contacts of the first set of contacts; and the second set of contacts may include two or more contacts, and the second contact may be one of the two or more contacts of the second set of contacts.

In the general aspect of the electrical fuse, the first and second contacts may be formed on the anode and the cathode outside an area defined by a virtual extension line of the fuse link.

In the general aspect of the electrical fuse, the first contact formed on the anode may be arranged farther away from the fuse link than the first contact formed on the cathode so as not to block a space where silicide shifted by electromigration during fusing accumulates.

In another general aspect, there is provided a method for fabricating an electrical fuse, the method involving: forming a semiconductor layer on a substrate; forming first, second and third semiconductor portions by patterning the semiconductor layer; forming an anode, a cathode and a fuse link connecting the anode and the cathode to each other by forming first, second and third metal silicide portions on the first, second and third semiconductor portions, respectively; forming a first contact on the anode; and forming a second contact on the cathode closer to the fuse link than the first contact.

In the general aspect of the method, the fuse link may be arranged between the anode and the cathode.

In the general aspect of the method, the cathode may include three regions of equal width lateral to a side of the cathode connected to the fuse link, and the second contact may be formed in a region connected to the fuse link among the three regions of equal width.

In the general aspect of the method, the anode, the cathode and the fuse link may be formed of a deposition structure of first, second and third semiconductor portions and first, second and third metal silicide portions.

In the general aspect of the method, the first, second and third semiconductor portions may be doped polysilicons or undoped polysilicons.

In the general aspect of the method, the first, second and third semiconductor portions may be formed in a single body.

In the general aspect of the method, the first, second and third metal silicide portions may include metal atoms selected from a group consisting of Ti, Co, Ni, Ta, Al, Zr, Hf, W, Pt, Pd, Mo and their combination.

The general aspect of the method may further include a first set of contacts formed on the anode and a second set of contacts formed on the cathode, in which the first set of contacts includes two or more contacts, and the first contact may be one of the two or more contacts of the first set of contacts; and the second set of contacts may include two or more contacts, and the second contact may be one of the two or more contacts of the second set of contacts.

In the general aspect of the method, the first and second contacts may be formed on the anode and the cathode outside an area defined by a virtual extension line of the fuse link.

In the general aspect of the method, the first contact formed on the anode may be arranged farther away from the fuse link than the second contact so as not to block a space where silicide shifted by electromigration during fusing accumulates.

In the general aspect of the method, the forming of the metal silicide portions may include forming a metal layer on the first, second and third semiconductor portions at a thickness of 5 nm to 50 nm, and forming silicide on a surface of the metal layer by carrying out heat treatment for the metal layer.

In the general aspect of the method, the silicide may have a thickness of 20 nm to 50 nm.

Other features and aspects may be apparent from the following detailed description, the drawings, and the claims.

Figure 1:
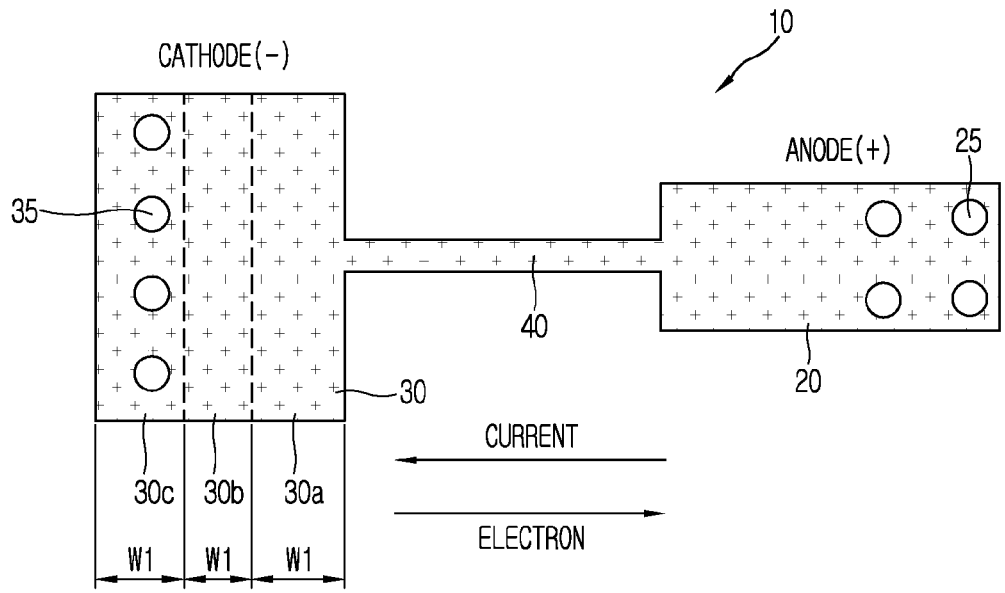
FIG. 1 is a schematic diagram of an electrical fuse in a plan view.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Hereinafter, a structure of an electrical fuse of a semiconductor device according to various examples will be described with reference to the accompanying drawings. The drawings may not be necessarily drawn to scale, and, in some instances, proportions may have been exaggerated in order to clearly illustrate features of the examples. When a first layer is referred to as being "on" a second layer or "on" a substrate, it may not only refer to a case where the first layer is formed directly on the second layer or the substrate but may also refer to a case where a third layer exists between the first layer and the second layer or the substrate.

In an electrical fuse system, a programming current flows through a fuse link, causing the fuse link to heat and open. This programming process may also be referred to as blowing the fuse.

An electrical fuse system may utilized a method of fully shorting a fuse of polysilicon to blow a fuse. In the alternative, an electrical fuse system may utilize a method for increasing resistance by removing only the silicide from the polysilicon through the shifting of metal ions. The shifting of metal ions occurs when a current flows through a metal, and this phenomenon is otherwise referred to as electromigration.

FIG. 1 is a schematic diagram illustrating an electrical fuse in a plan view.

The electrical fuse 10 illustrated in FIG. 1 includes an anode 20, a cathode 30, and a fuse link 40 connecting the anode 20 and the cathode 30 to each other. In addition, the cathode 30 can be divided in three regions 30a, 30b, 30c of an equal width W1, and contacts 35 are located in area 30c of the cathode 30 on the opposite side from the fuse link 40.

In this electrical fuse 10, the anode 20 is connected to a drain (not shown) of a transistor (not shown). When the transistor is driven, a plurality of electrons flow from the cathode 30 to the anode 20 through the fuse link 40, and the silicide is also shifted equally, whereby fuse blowing occurs with some of the electrons being removed and others accumulating in the fuse link 40. As the resistance of the portion from which the silicide is removed by the fuse blowing increases, the fuse 10 is opened.

If the electrical fuse 10 has a resistance value of about 100 to 300 ohm, the electrical fuse 10 is no longer programmable.

After a given voltage and a given current are applied to both ends of the anode 20 and the cathode 30 so that electromigration of the electrical fuse 10 may occur, if a certain length of time passes, the electrical fuse 10 may be programmed. At the time, if electromigration occurs, the electrical fuse 10 has a resistance value of several K ohm to several tens of M ohm.

Figure 2:
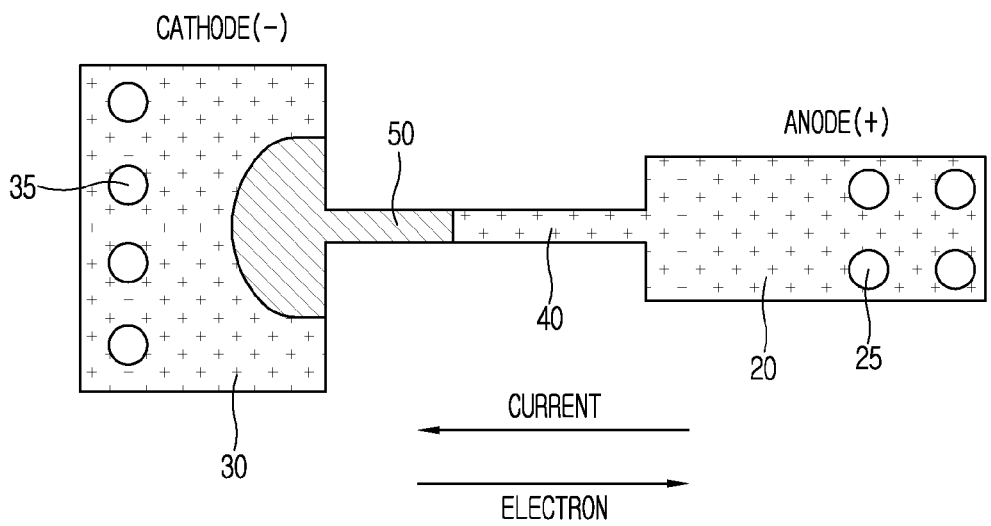
FIG. 2 is a schematic diagram of the electrical fuse of FIG. 1 in a plan view that illustrates a programmed state of the electrical fuse.

FIG. 2 is a schematic diagram illustrating the electrical fuse of FIG. 1 in a programmed state in a plan view.

In FIG. 2, the silicide layer of the electrical fuse is removed from a portion 50 of the fuse that extends from the portions of the cathode 30 and the fuse link 40 of the electrical fuse 10 by an electromigration when the electrical fuse 10 is programmed.

In the electrical fuse illustrated in FIGS. 1 and 2, the contacts 35 are located in area A of the cathode 30, and the width of the cathode 30 is wider than the fuse link 40. Thus, the area of the cathode 30 of the electrical fuse 10 where the electromigration occurs is widely increased and the silicide layer is removed broadly over area A of the cathode 30 and the fuse link 40 as the result of the contacts 35 being arranged at the farthest end of the cathode 30, for example in area A at positions opposite to the fuse link 30, to obtain the desired resistance of the electrical fuse 10.

In this case, although the electrical fuse 10 may be programmed relative-stably, a large electrical current should be applied to the electrical fuse to generate sufficient electromigration over the wide area of the cathode 30.

Thus, when the contacts are arranged at an end portion of the cathode opposite from the fuse link, the electromigration must occur over a relatively wide area, whereby a large current is required to program the electrical fuse.

Figure 3:
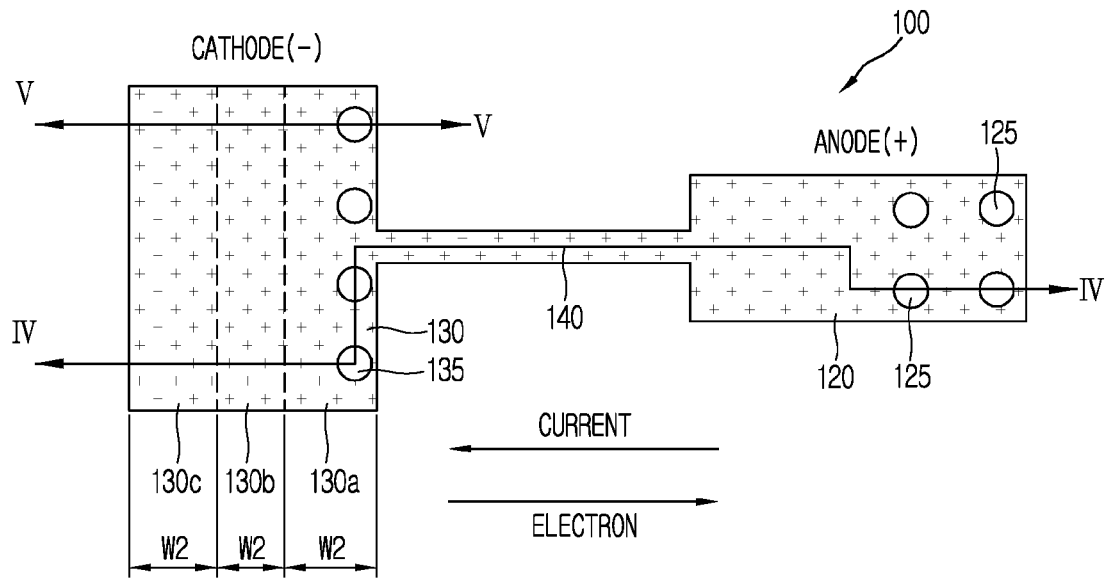
FIG. 3 is a schematic diagram of an example of an electrical fuse in a plan view according to a general aspect.

FIG. 3 is a schematic diagram of an example of an electrical fuse in a plan view.

Figure 4:
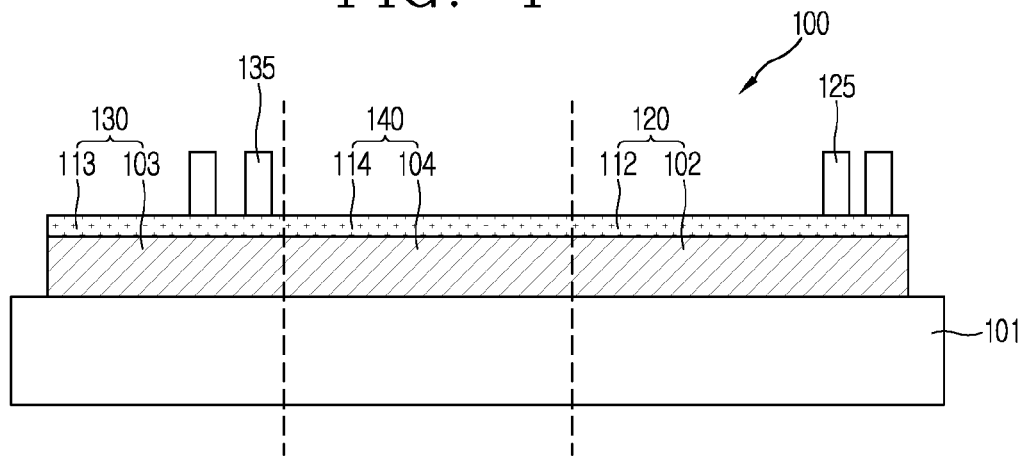
FIG. 4 is a cross-sectional view of the electrical fuse illustrated in FIG. 3 along line IV-IV.

FIG. 4 is a cross-sectional view of the electrical fuse illustrated in FIG. 3 along line IV-IV of FIG. 3.

Figure 5:
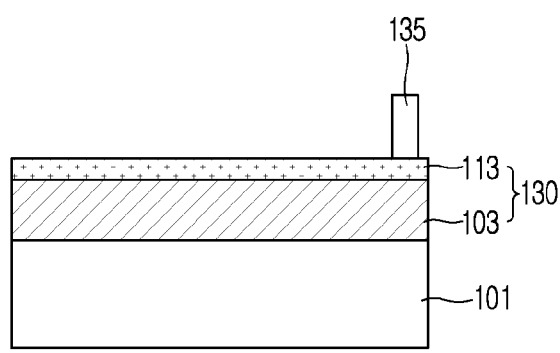
FIG. 5 is a cross-sectional view of a cathode portion of the electrical fuse illustrated in FIG. 3 along line V-V.

FIG. 5 is a cross-sectional view of a cathode portion of the electrical fuse along line V-V of FIG. 3.

As shown in FIGS. 3 to 5, the electrical fuse 100 includes a semiconductor substrate 101, an anode 120 that is formed on the semiconductor substrate 101 and includes a first semiconductor portion 102 and a first metal silicide portion 112, a cathode 130 that is formed on the semiconductor substrate 101 and includes a second semiconductor portion 103 and a second metal silicide portion 113, a fuse link 140 that is arranged between the anode 120 and the cathode 130 to connect the anode 120 and the cathode 130 with each other and includes a third semiconductor portion 104 and a third metal silicide portion 114, a first set of contacts 125 formed on the anode 120, and a second set of contacts 135 formed on the cathode 130 and located at the closest corner portion from the fuse link 140.

Further, the cathode 130 can be divided into three separate regions 103a, 130b, 130c of an equal width W2 that are lateral to a side that is connected to the fuse link 140. In this electrical fuse 100, the second set of contacts 135 are formed in a region 130a that is connected to the fuse link 140. Thus, the second set of contacts 135 are formed close to the fuse link 140.

In this example, the semiconductor substrate 101 includes a semiconductor layer (not shown) and an insulation region (not shown).

The semiconductor substrate 101 may be a bulk semiconductor substrate, a semiconductor on insulator (SOI), or a hybrid semiconductor substrate having a bulk portion and SOI portion. The semiconductor layer (not shown) includes a semiconductor material such as silicon, an alloy including silicon, an alloy including germanium, III-V group compound semiconductor, or II-IV group compound semiconductor.

The insulation region (not shown) includes a dielectric material such as a silicon oxide film, a silicon nitride film, an insulating metal oxide film, or an insulating metal nitride film.

Also, the first, second and third semiconductor portions 102, 103 and 104 may be integrally formed in a single body, and may be formed of the same semiconductor material. For example, the first, second and third semiconductor portions 102, 103 and 104 may be formed of doped or undoped polysilicon.

The first corner portion of the third semiconductor portion 104, which constitutes the fuse link 140, is formed in contact with the first semiconductor portion 102. The second corner portion of the third semiconductor portion 104, which constitutes the fuse link 140, is formed in contact with the second semiconductor portion 103.

For metallization of exposed semiconductor surfaces, a metal layer (not shown) is formed on the first, second and third semiconductor portions 102, 103 and 104.

The metal layer includes a metal that may be reacted with the semiconductor material of the first, second and third semiconductor portions 102, 103 and 104 to form a metal semiconductor alloy. Preferably, a transition metal is used as the metal layer. For example, at least one of metal atoms such as Ti, Co, Ni, Ta, Al, Zr, Hf, W, Pt, Pd, Mo and their combination may be used as the metal layer. Also, in order that electromigration is performed desirably, the metal layer may be formed at a thickness of 5 nm to 50 nm. Accordingly, it is preferable that silicide is formed at a thickness of 20 nm to 50 nm. This is because fusing operation becomes unstable if the thickness of the silicide is too thin; in addition, current consumption for fusing may increased excessively if the thickness of the silicide is too thick.

If the semiconductor material of the first, second and third semiconductor portions 102, 103 and 104 includes silicon, the metal layer reacts with the first, second and third semiconductor portions 102, 103 and 104. The reaction produces a metal silicide layer. The metal silicide layer includes first, second and third silicide portions 112, 113 and 114. The metal silicide layer may include metal atoms such as Ti, Co, Ni, Ta, Al, Zr, Hf, W, Pt, Pd, Mo or their combination.

In the illustrated example, the first metal silicide portion 112 is formed on the first semiconductor portion 102. The second metal silicide portion 113 is formed on the second semiconductor portion 103. The third metal silicide portion 114 is formed on the third semiconductor portion 104.

At least one of the first set of contacts 125 is directly formed on the first metal silicide portion 112 to electrically connect the anode 120, and at least one of the second set of contact 135 is directly formed on the second metal silicide portion 113 to electrically connect the cathode 130. A plurality of the second contacts 135 are formed at given intervals in a vertical direction with respect to the fuse link 140. In particular, the plurality of second contacts 135 are arranged at the corner portion on the second metal silicide portion 113 that is the closest to the fuse link 140 if possible and constitutes the cathode 130.

In this example, the first set of contacts 125 and the second set of contacts 135 are arranged on the anode 120 and the cathode 130 outside of an area defined by the virtual extension lines 140a of the fuse link 140. The virtual extension lines 140a are straight lines. By not forming contacts within this area, shifting of silicide due to electromigration during fusing is not blocked.

In this example, the first set of contacts 125 is formed on the anode arranged far away from the fuse link so as not to block a space where silicide shifted by electromigration during fusing will accumulate.

Also, the cathode 130 may have an area greater than or equal to that of the anode 120. For instance, the cathode 130 may have a broader width than the anode 120.

An operation of the example of the electrical fuse configured as above will be described with reference to FIG. 6.

Figure 6:
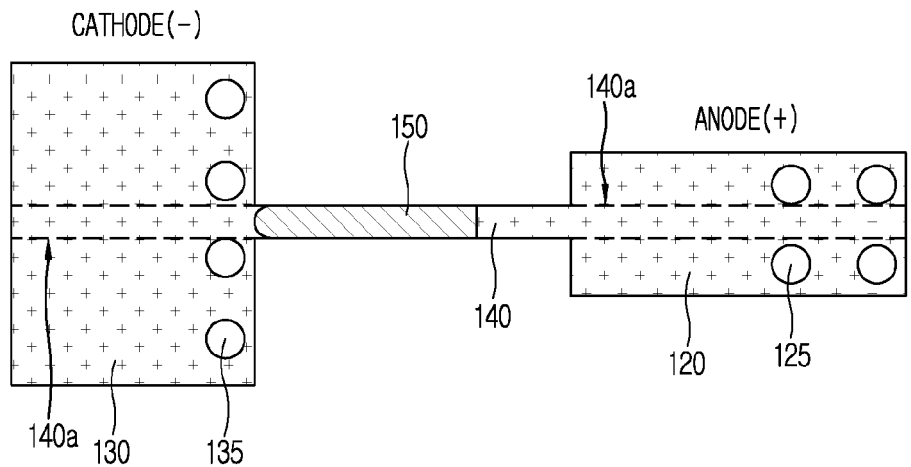
FIG. 6 is a plan view of an example of an electrical fuse that illustrates a programmed state of the electrical fuse.

FIG. 6 is a plan view of an example of electrical fuse that illustrates a programmed state of the electrical fuse.

In order that electromigration may occur in the electrical fuse 100, after a given voltage and a given current are applied to both ends of the anode 120 and the cathode 130, if a certain time passes, the electrical fuse 100 may be programmed.

If electromigration occurs, silicide of the electrical fuse 100 is shorted by strong current, whereby a resistance value is greatly increased.

In particular, according to the related art, as shown in FIG. 2, since silicide loss 50 occurs in a wide area of the cathode 30, a relative high current should be applied to the electrical fuse. On the other hand, as shown in FIG. 6, silicide loss 150 is limited to the fuse link 140 portion of the electrical fuse 100 without occurring at one side, which is the left side of the contacts 135 of the cathode 130 in the illustrated example.

Accordingly, in the illustrated electrical fuse, since silicide loss 150 is limited to the fuse link 140 portion of the electrical fuse 100, a loss area of silicide is reduced, whereby the electrical fuse 100 may be programmed efficiently even though a low current is applied to the electrical fuse.

Figure 7:
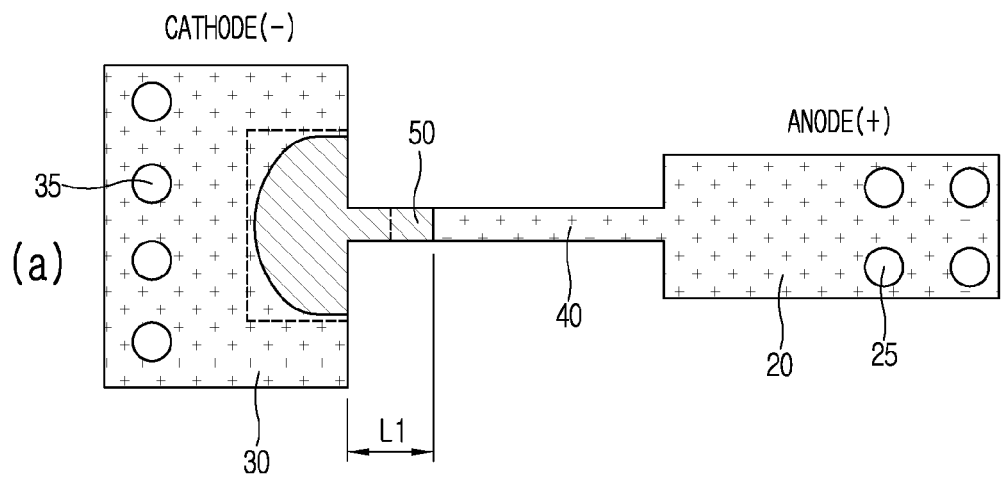
FIG. 7(a) is a plan view of a comparative example of an electrical fuse that illustrates a loss state of silicide after the comparative example electrical fuse is programmed.
FIG. 7(b) is a plan view of an example of an electrical fuse according to a general aspect that illustrates a loss state of silicide after the electrical fuse is programmed.
Figure 7:
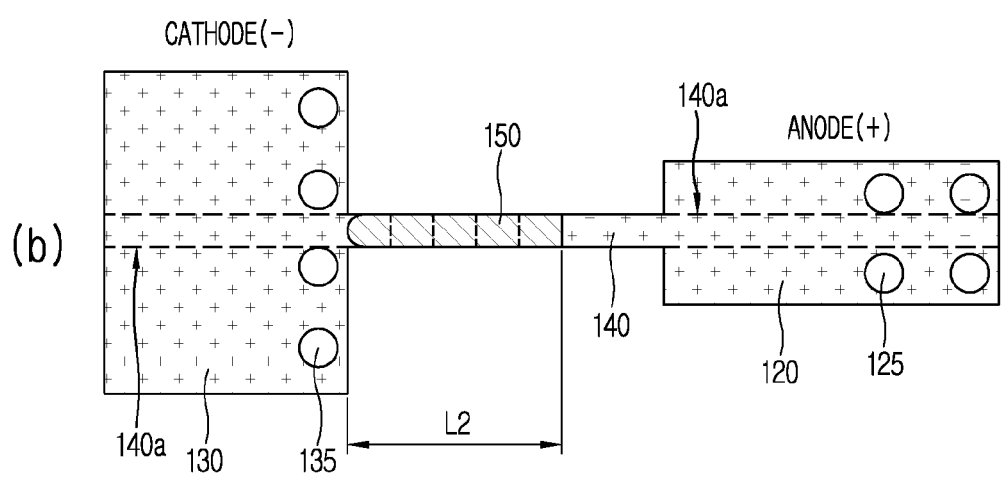

FIGS. 7(a) and 7(b) are plan views of two different electrical fuses that illustrates a loss state of silicide after the electrical fuses are programmed. FIG. 7(a) illustrates an example of an electrical fuse in which the electrical fuse is programmed in a conventional manner, and FIG. 7(b) illustrates an example of an electrical fuse in which the electrical fuse is programmed using a low current.

As shown in FIG. 7(b), in an example of the electrical fuse 100 programmed using a low current, a total loss area of silicide 150 is narrower than that of the electrical fuse 100 illustrated in FIG. 7(a). However, since a loss area of silicide corresponding to the fuse link 140 portion of the electrical fuse 100 becomes wider than that illustrated in FIG. 7(a), a resistance value higher than that of the electrical fuse illustrated in FIG. 7(a) is obtained after the electrical fuse 100 is programmed. In FIG. 7(a), a distance between edge of the cathode 30 and the contact 25 is from 1.0 to 4.0 μm and typically 2.3 μm. Further, a distance between edge of the cathode 30 and the contact 35 is from 0.2 to 2.0 μm and typically 1.0 μm. In FIG. 7(a), a length L1 has a range of from 0.2 to 0.4 μm and typically 0.3 μm.

In case of the electrical fuse illustrated in FIG. 7(a), silicide loss 50 occurs in a wide area of the cathode 30 of the electrical fuse 10. However, in case of the electrical fuse illustrated in FIG. 7(b), it is noted that silicide loss 150 is limited to the fuse link 140 portion of the electrical fuse 100 as shown in FIG. 6. In other words, in case of the electrical fuse illustrated in FIG. 7(a), it is noted that silicide loss 150 mainly occurs in the fuse link 140 portion of the electrical fuse 100 and a silicide loss length 12 at the fuse link 140 portion of the electrical fuse 100 is longer than a silicide loss length 11 of the related art if the electrical fuse is programmed by the same condition.

In FIG. 7(b), a distance between the cathode 130 and the second contact 125 is from 1.0 to 4.0 μm and typically 2.3 μm. Further, a length L2 has a range of from 0.5 to 0.9 μm and typically 0.7 μm. Accordingly, since a resistance R is proportional to a length I and inverse-proportional to a sectional area A as expressed by the following equation (1), the resistance of the electrical fuse 100 is mainly determined by the fuse link 140 portion of the electrical fuse 100, whereby the resistance of the electrical fuse 100 is greater than that of the electrical fuse programmed in the conventional manner if the electrical fuse is programmed under the same condition.

$$R=\rho l/A \text{ (}R\text{: resistance, } \rho\text{: resistance rate, } I\text{: length, } A\text{: sectional area)} \quad (1)$$

Figure 9:
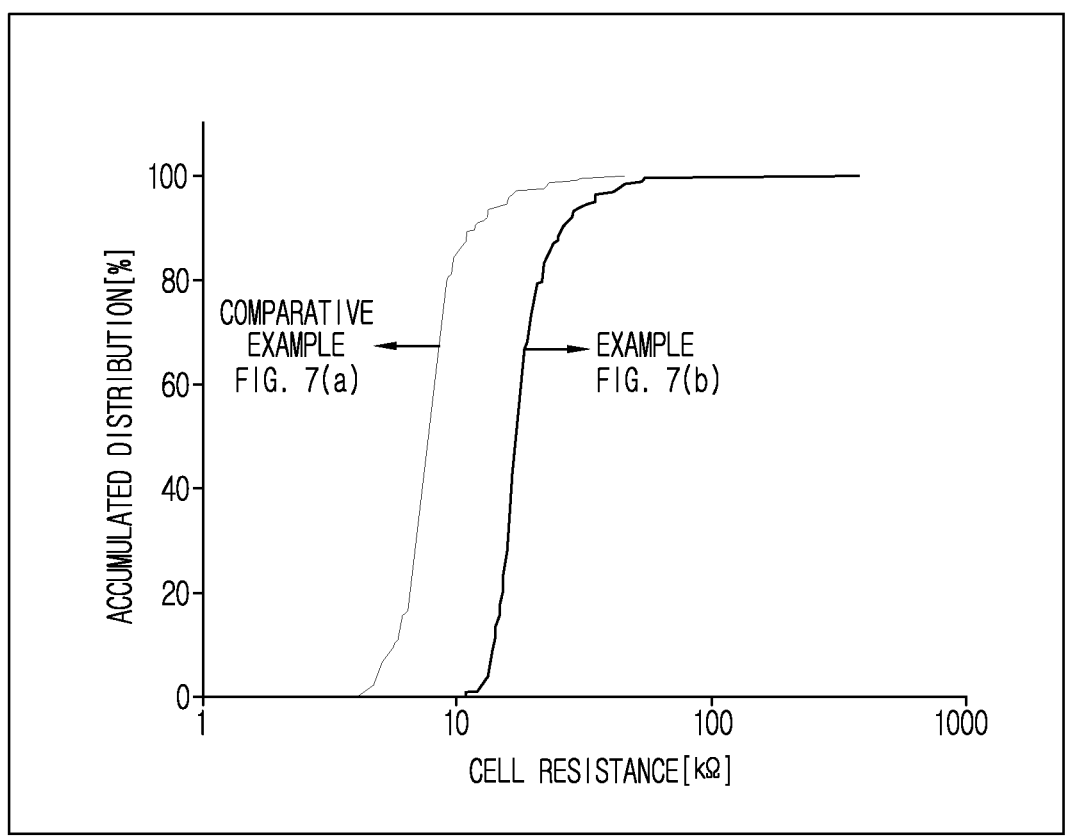
FIG. 9 is a graph illustrating the variation of accumulated distribution based on cell resistance after an electrical fuse according to a general aspect is programmed.

FIG. 9 is a graph illustrating the variation of accumulated distribution based on cell resistance after an electrical fuse illustrated in FIG. 7(b) is programmed.

As shown in FIG. 9, if the electrical fuse 100 is programmed under the same current condition and the same voltage condition, it is noted that the electrical fuse 100 illustrated in FIG. 7(b) has a resistance value greater than that of the electrical fuse illustrated in FIG. 7(a).

Thus, by applying a lower current than that of the conventional art to obtain the same resistance value, the electrical fuse 100 may be programmed more efficiently than in the conventional art.

Meanwhile, a method for fabricating the aforementioned electrical fuse of the semiconductor device will be described with reference to FIGS. 8A to 8H.

FIGS. 8A to 8H are cross-sectional views illustrating an example of a process of fabricating an electrical fuse.

Figure 8A:
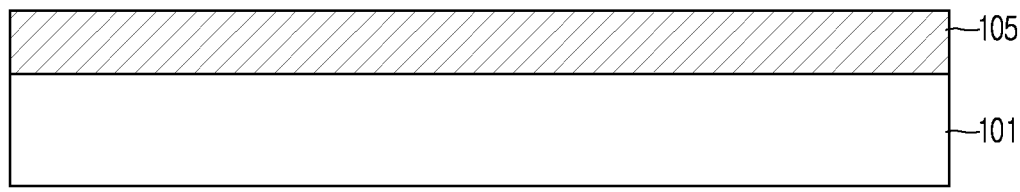
FIGS. 8A to 8H are cross-sectional views illustrating an example of a process of fabricating an electrical fuse according to a general aspect.

As shown in FIG. 8A, a semiconductor layer 105 is deposited on a semiconductor substrate 101. At this time, the semiconductor layer 105 is deposited using Chemical Vapor Deposition, LPCVD (Low Pressure Chemical Vapor Deposition), RTCVD (Rapid Thermal Chemical Vapor Deposition), or PECVD (Plasma Enhanced Chemical Vapor Deposition).

At this time, the semiconductor substrate 101 includes a semiconductor layer (not shown) and an insulation region (not shown). The semiconductor substrate 101 may be a bulk semiconductor substrate, a semiconductor on insulator (SOI), or a hybrid semiconductor substrate having a bulk portion and SOI portion. Also, the insulation region (not shown) of the semiconductor substrate includes a dielectric material such as a silicon oxide film, a silicon nitride film, an insulating metal oxide film, or an insulating metal nitride film.

A doped polysilicon or undoped polysilicon may be used as the semiconductor layer 105, or a semiconductor material such as silicon, an alloy containing silicon, an alloy containing germanium, III-V semiconductor or II-IV semiconductor may be used as the semiconductor layer 105.

Figure 8B:
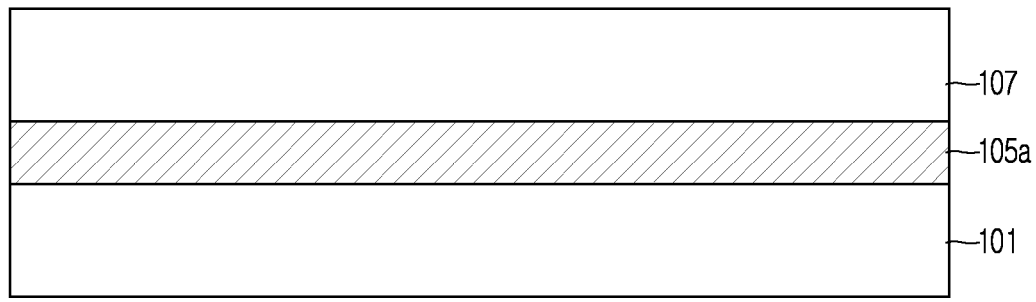

Next, as shown in FIG. 8B, a first photoresist film 107 is deposited on the semiconductor layer 105.

Figure 8C:
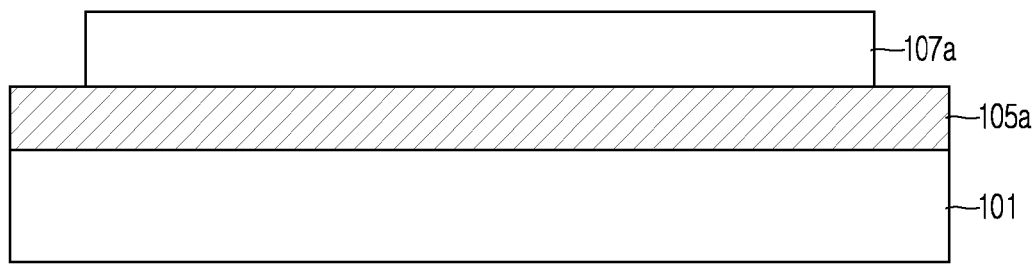

Subsequently, as shown in FIG. 8C, the first photoresist film 107 is selectively removed through exposing and developing processes based on a photolithography process, whereby a first photoresist film pattern 107a is formed.

Figure 8D:
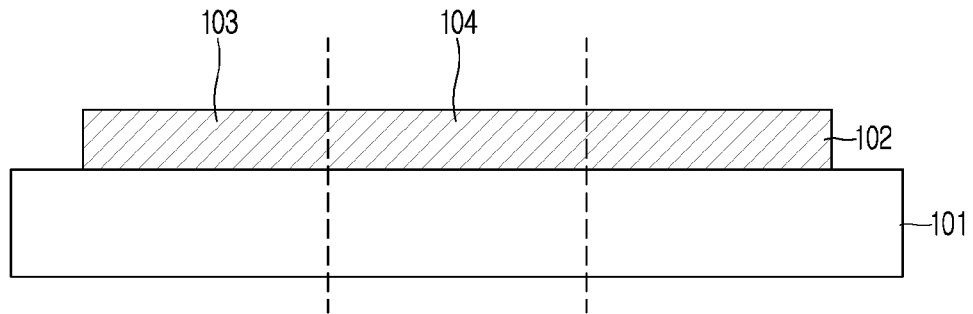

As shown in FIG. 8D, the semiconductor layer 105 is selectively etched using the first photoresist film pattern 107a as an etching mask, whereby first, second and third semiconductor portions 102, 103 and 104 are formed. At this time, the first, second and third semiconductor portions 102, 103 and 104 may be formed in a single body, and may be formed of the same semiconductor material, for example, doped polysilicon or undoped polysilicon.

Also, as shown in FIG. 3, the first corner portion of the third semiconductor portion 104 is formed in contact with the first semiconductor portion 102 in a single body, and the second corner portion of the third semiconductor portion 104 is formed in contact with the second semiconductor portion 103 in a single body.

Figure 8E:
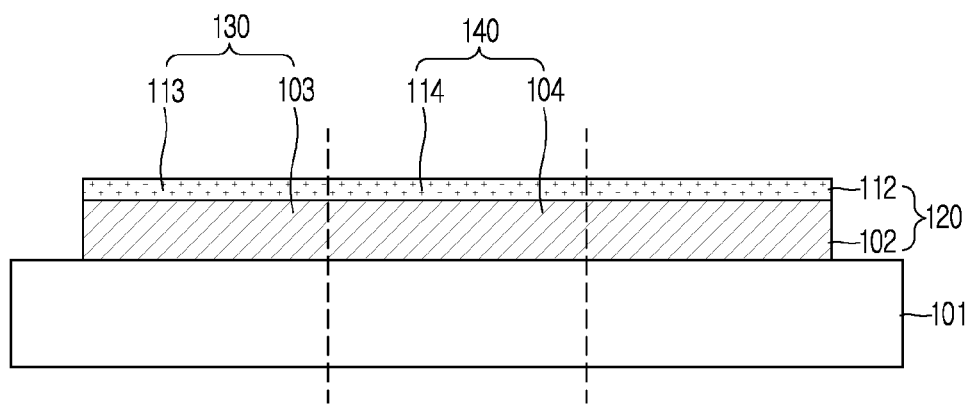

Subsequently, as shown in FIG. 8E, the first photoresist film pattern 107a is removed. Then, for the metallization of the surfaces of the first, second and third semiconductor portions 102, 103 and 104, a metal layer (not shown) is deposited on the surfaces of the first, second and third semiconductor portions 102, 103 and 104.

At this time, the metal layer includes metal that may be reacted with the semiconductor material of the first, second and third semiconductor portions 102, 103 and 104 to form a metal semiconductor alloy. Preferably, a transition metal is used as the metal layer. At this time, at least one of metal atoms such as Ti, Co, Ni, Ta, Al, Zr, Hf, W, Pt, Pd, Mo and their combination is used as the metal layer. Also, in order that electromigration is performed desirably, the metal layer may be formed at a thickness of 5 nm to 50 nm. Accordingly, it is preferable that silicide is formed at a thickness of 20 nm to 50 nm. This is because fusing operation becomes unstable if the thickness of the silicide is too thin; in addition, the current consumption for fusing may increase excessively if the thickness of the silicide is too thick.

If the semiconductor material of the first, second and third semiconductor portions 102, 103 and 104 includes silicon, the metal layer reacts with the first, second and third semiconductor portions 102, 103 and 104, whereby a metal silicide layer is formed. At this time, the metal silicide layer includes first, second and third silicide portions 112, 113 and 114. The metal silicide layer may include metal atoms such as Ti, Co, Ni, Ta, Al, Zr, Hf, W, Pt, Pd, Mo or their combination.

The first metal silicide portion 112 is formed on the first semiconductor portion 102, the second metal silicide portion 113 is formed on the second semiconductor portion 103, and the third metal silicide portion 114 is formed on the third semiconductor portion 104. Accordingly, the first semiconductor portion 102 and the second metal silicide portion 112 constitute the anode 120, the second semiconductor portion 103 and the second metal silicide portion 113 constitute the cathode 130, and the third semiconductor portion 104 and the third metal silicide portion 114 constitute the fuse link 140 that connects the anode 120 with the cathode 130.

Figure 8F:
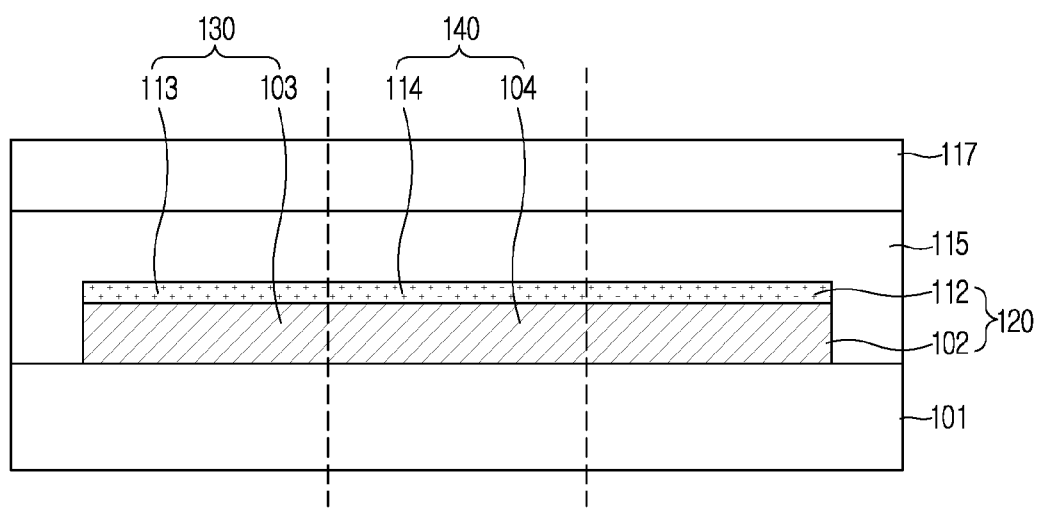

Next, as shown in FIG. 8F, the metal layer 115 is deposited on the entire surface of the substrate including the first, second and third metal silicide portions 112, 113 and 114. Thereafter, a second photoresist film 117 is deposited on the metal layer 115. At this time, the metal layer 115 is formed using CVD (Chemical Vapor Deposition), PVD (Physical Vapor Deposition), ALD (Atomic Layer Deposition), or other deposition method.

Figure 8G:
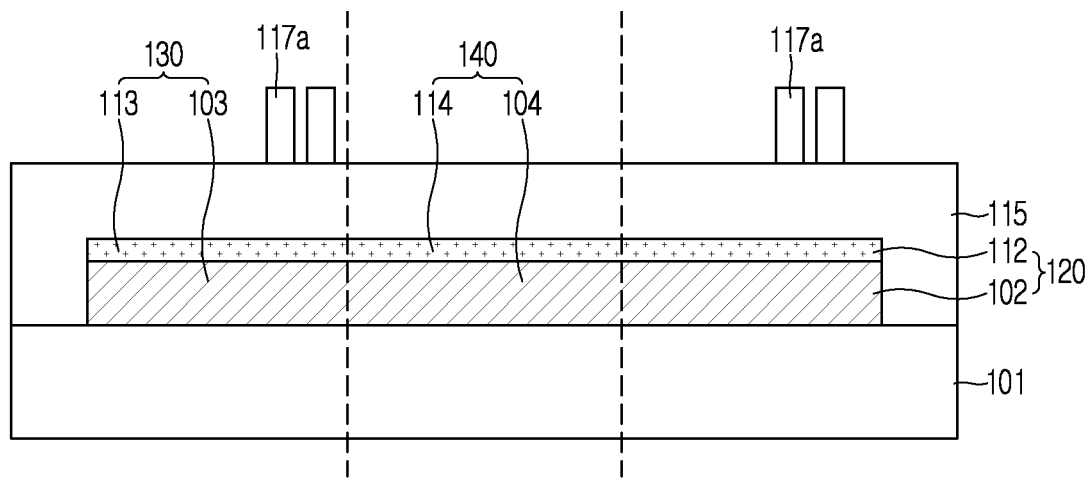
Figure 8H:
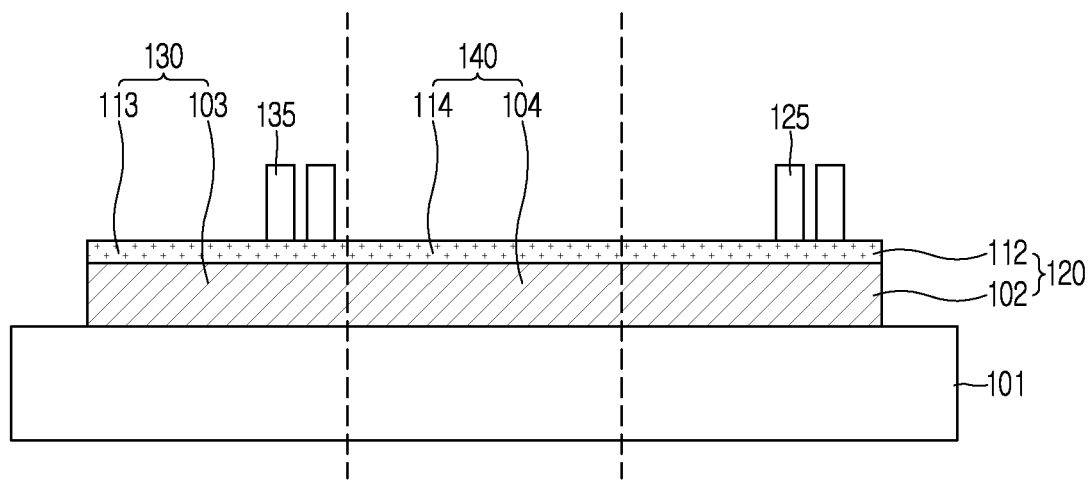

Subsequently, as shown in FIG. 8G, the second photoresist film 117 is removed through exposing and developing processes based on a photolithography process, whereby a second photoresist film pattern 117a is formed. Then, as shown in FIG. 8H, the metal layer 115 is etched using the second photoresist film pattern 117a as an etching mask, whereby a plurality of first contacts 125 are formed in the first electrode 120, and a plurality of second contacts 135 are formed in the second electrode 130. At this time, the first contacts are directly formed on the first metal silicide portion 112 to electrically connect the anode 120, and at least one of the second contacts 135 is directly formed on the second metal silicide portion 113 to electrically connect the cathode 130. At this time, the second contacts 135 are formed at constant intervals in a vertical direction with respect to the fuse link 140. In particular, the plurality of second contacts 135 are arranged at the corner portion on the second metal silicide portion 113 that is the closest to the fuse link 140 if possible. In other words, the second contacts 135 are arranged at the corner portion of the second metal silicide portion 113 that is the closest to the fuse link 140 if possible and constitutes the cathode 130.

Also, it is preferable that first contacts 125 and the second contacts 135 are arranged on the anode 120 and the cathode 130 except inside an extension line, so as not to stop shifting of silicide due to electromigration during fusing. The extension line may be an area between two straight lines along the fuse link 140.

Preferably, the first contacts 125 are formed on the anode 120 arranged far away from the fuse link 140 so as not to block a space where silicide shifted by electromigration during fusing will be accumulated.

Subsequently, although not shown, the second photoresist film pattern 117a is removed, whereby the process of fabricating the electrical fuse 100 of the semiconductor device is completed.

As described above, according to the above described examples of electrical fuse of a semiconductor device and the method of fabricating the same, the contacts of the cathode are arranged to be close to the fuse link portion if possible to minimize a loss area of silicide, which is caused by electromigration, to the fuse link portion, whereby a great fuse resistance value may be obtained with low current consumption.

Various examples of electrical fuses and methods for fabricating the same are provided above. The examples of the electrical fuses and methods of fabricating the same may substantially improve issues that occur due to the arrangement of the contacts at the far end of a wide area of a cathode from a fuse link.

In an electrical fuse and a method for fabricating the same disclosed above, a contact of a cathode may be arranged to be close to a fuse link to possibly minimize a loss area of silicide, which is caused by electromigration, to the fuse link portion. Thus, a great resistance value may be obtained with a low current consumption.

To achieve these and other benefits, as embodied and broadly described herein, an example of an electrical fuse provided above. In that example, the electrical fuse includes: a first electrode formed on a semiconductor substrate; a second electrode formed on the semiconductor substrate; a fuse link arranged between the first electrode and the second electrode and connecting the first electrode and the second electrode to each other; a first contact formed on the anode; and a second contact formed on the second electrode and arranged at a corner portion of the second electrode closest to the fuse link among the contacts formed on the second electrode.

There are also provided above an example of a method for fabricating an electrical fuse of a semiconductor device, the method involving: forming a semiconductor layer on a semiconductor substrate; forming first, second and third semiconductor portions by patterning the semiconductor layer; forming a first electrode, a second electrode and a fuse link connecting the first electrode and the second electrode with each other by forming first, second and third metal silicide portions on the first, second and third semiconductor portions, respectively; forming a first contact on the first electrode; and forming a second contact at a corner portion on the second electrode closest to the fuse link.

According to the electrical fuse of a semiconductor device and the method for fabricating the same, the contact of the cathode is arranged to be close to the fuse link portion to minimize a loss area of silicide, which is caused by electromigration, to the fuse link portion, whereby a great fuse resistance value may be obtained with low current consumption after blowing.

Further scope of applicability of the electrical fuse are apparent from the detailed description provided above. However, it should be understood that the detailed description and specific examples, while indicating preferred embodiments, are given by way of illustration only, since various changes and modifications within the spirit and scope of the invention are suggested and apparent to those skilled in the art from the above detailed description.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An electrical fuse, comprising:
   an anode formed on a substrate;
   a cathode formed on the substrate;
   a fuse link connecting the anode and the cathode to each other;
   a first contact formed on the anode; and
   a second contact formed on the cathode and arranged closer to the fuse link than the first contact, wherein the second contact is arranged closer to an edge of the cathode proximal to the fuse link than an edge of the cathode distal to the fuse link, and wherein an area defined by virtual extension of the fuse link, extending from the edge of the cathode distal to the fuse link to an edge of the anode distal to the fuse link, has no contact formed thereon.

2. The electrical fuse according to claim 1, wherein the fuse link is arranged between the anode and the cathode.

3. The electrical fuse according to claim 1, wherein the cathode comprises three regions of equal width lateral to a side of the cathode connected to the fuse link, and the second contact is formed in a region most proximal to the fuse link among the three regions of equal width.

4. The electrical fuse according to claim 1, wherein the anode, the cathode and the fuse link are a deposition structure of semiconductor portions and metal silicide portions.

5. The electrical fuse according to claim 4, wherein the semiconductor portions are doped polysilicons or undoped polysilicons.

6. The electrical fuse according to claim 4, wherein the metal silicide portions include metal atoms selected from a group consisting of Ti, Co, Ni, Ta, Al, Zr, Hf, W, Pt, Pd, Mo and their combination.

7. The electrical fuse according to claim 4, wherein the metal silicide portion has a thickness of 20 nm to 50 nm.

8. The electrical fuse according to claim 1, further comprising a first set of contacts formed on the anode and a second set of contacts formed on the cathode, wherein the first set of contacts includes two or more contacts, and the first contact is one of the two or more contacts of the first set of contacts; and the second set of contacts includes two or more contacts, and the second contact is one of the two or more contacts of the second set of contacts.

9. The electrical fuse according to claim 1, wherein the first contact formed on the anode is disposed outside of a silicide loss area.

10. The electrical fuse according to claim 1, wherein a silicide loss region is disposed entirely within the fuse.

11. The electrical fuse according to claim 1, wherein the cathode has an area greater than or equal to an area of the anode.

12. A method for fabricating an electrical fuse, the method comprising:

forming a semiconductor layer on the substrate;

forming first, second and third semiconductor portions by patterning the semiconductor layer;

forming an anode, a cathode and a fuse link connecting the anode and the cathode to each other by forming first, second and third metal silicide portions on the first, second and third semiconductor portions, respectively;

forming a first contact on the anode; and forming a second contact on the cathode closer to the fuse link than the first contact, wherein an area defined by virtual extension of the fuse link has no contact formed thereon.

13. The method according to claim 12, wherein the fuse link is arranged between the anode and the cathode.

14. The method according to claim 12, wherein the cathode comprises three regions of equal width lateral to a side of the cathode connected to the fuse link, and the second contact is formed in a region connected to the fuse link among the three regions of equal width.

15. The method according to claim 12, wherein the anode, the cathode and the fuse link are formed of a deposition structure of first, second and third semiconductor portions and first, second and third metal silicide portions.

16. The method according to claim 12, wherein the first, second and third semiconductor portions are doped polysilicons or undoped polysilicons.

17. The method according to claim 12, wherein the first, second and third semiconductor portions are formed in a single body.

18. The method according to claim 12, wherein the first, second and third metal silicide portions include metal atoms selected from a group consisting of Ti, Co, Ni, Ta, Al, Zr, Hf, W, Pt, Pd, Mo and their combination.

19. The method according to claim 12, further comprising a first set of contacts formed on the anode and a second set of contacts formed on the cathode, wherein the first set of contacts includes two or more contacts, and the first contact is one of the two or more contacts of the first set of contacts; and the second set of contacts includes two or more contacts, and the second contact is one of the two or more contacts of the second set of contacts.

20. The method according to claim 12, wherein the first contact formed on the anode is disposed outside of a silicide loss area.

21. The method according to claim 12, wherein the forming of the metal silicide portions includes forming a metal layer on the first, second and third semiconductor portions at a thickness of 5 nm to 50 nm, and forming silicide on a surface of the metal layer by carrying out heat treatment for the metal layer.

* * * * *